US010066829B2

(12) United States Patent
Wong et al.

(10) Patent No.: US 10,066,829 B2
(45) Date of Patent: Sep. 4, 2018

(54) ELECTRONIC FABRIC

(71) Applicants: William S. Wong, Waterloo (CA); John S. Morreale, Austin, TX (US)

(72) Inventors: William S. Wong, Waterloo (CA); John S. Morreale, Austin, TX (US)

(*) Notice: Subject to any disclaimer, the term of this patent is extended or adjusted under 35 U.S.C. 154(b) by 174 days.

(21) Appl. No.: 15/139,648

(22) Filed: Apr. 27, 2016

(65) Prior Publication Data
US 2016/0320037 A1 Nov. 3, 2016

Related U.S. Application Data

(60) Provisional application No. 62/327,630, filed on Apr. 26, 2016, provisional application No. 62/153,681, filed on Apr. 28, 2015.

(51) Int. Cl.
*F21V 33/00* (2006.01)
*H05K 1/03* (2006.01)
(Continued)

(52) U.S. Cl.
CPC ......... *F21V 33/0008* (2013.01); *H05K 1/038* (2013.01); *H05K 1/189* (2013.01); *A41D 1/005* (2013.01); *A41D 27/085* (2013.01); *F21Y 2107/70* (2016.08); *F21Y 2115/10* (2016.08); *H05K 1/114* (2013.01); *H05K 2201/10106* (2013.01)

(58) Field of Classification Search
CPC .. A41D 1/005; A41D 27/085; F21V 33/0008; F21Y 2107/70; F21Y 2115/10; H05K 1/038; H05K 1/114; H05K 1/189
See application file for complete search history.

(56) References Cited

U.S. PATENT DOCUMENTS 7,592,276 B2 * 9/2009 Hill .................. D02G 3/441
  313/511
2002/0155214 A1 * 10/2002 Murasko .............. G09F 13/22
  427/66
(Continued)

FOREIGN PATENT DOCUMENTS

GB 2396252 A 6/2004

OTHER PUBLICATIONS

Cherenack, K. et al., "Smart Textiles: Challenges and Opportunities," Journal of Applied Physics, vol. 112, 091301 (2012), 15 pages.

*Primary Examiner* — Ali Alavi
(74) *Attorney, Agent, or Firm* — RMCK Law Group, PLC

(57) ABSTRACT

An electronic fabric can include a first fabric layer, a second fabric layer, and a plurality of electronic devices. The first fabric layer can include a first set of conductive wires extending longitudinally in a first direction. The second fabric layer can define a plurality of apertures, can include a second set of conductive wires extending longitudinally in a second direction, and can be coupled to the first fabric layer such that each of the first set of conductive wires is arranged at a location of one of the plurality of apertures. Each electronic device can have a first terminal electrically coupled with one of the first set of conductive wires and a second terminal electrically coupled to one of the second set of conductive wires. The first terminal can be electrically coupled with the one of the first set of conductive wires through one of the plurality of apertures.

20 Claims, 7 Drawing Sheets

(51) Int. Cl.
*H05K 1/18* (2006.01)
*F21Y 115/10* (2016.01)
*F21Y 107/70* (2016.01)
*H05K 1/11* (2006.01)
*A41D 27/08* (2006.01)
*A41D 1/00* (2018.01)

(56) References Cited

U.S. PATENT DOCUMENTS

| 2008/0196783 A1* | 8/2008 | Van Bruggen | D03D 1/0088 |
| | | | 139/319 |
| 2008/0198578 A1* | 8/2008 | Finn | A41B 9/04 |
| | | | 362/103 |
| 2012/0032224 A1* | 2/2012 | Fang | H01R 4/58 |
| | | | 257/99 |

* cited by examiner

ELECTRONIC FABRIC

CROSS-REFERENCE TO RELATED APPLICATIONS

This application claims the benefit of U.S. Provisional Application No. 62/153,681, filed Apr. 28, 2015 and U.S. Provisional Application No. 62/327,630, filed Apr. 26, 2016. The entire disclosure of each of the above applications are incorporated herein by reference.

FIELD

The present disclosure relates to an electronic fabric that includes one or more electronic components, and, more particularly, to a flexible fabric that incorporates a plurality of individually addressable electronic components such as light emitting diodes.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronics and electronic devices are increasingly being incorporated into everyday items. For example, light emitting diodes ("LEDs") have been added to apparel and other fabric items for stylistic and other illumination purposes. In such items, electronic components and their associated componentry (e.g., the power source, electrical connections and other circuitry) are typically added (sewed, glued, etc.) to an already manufactured item. The appearance of the resulting item may be less appealing, and the manufacturing process may be more complex and/or expensive, than what is desired.

Accordingly, there remains a need for an improved electronic fabric that addresses the above described and other disadvantages.

SUMMARY

According to certain aspects of the present disclosure, an electronic fabric is disclosed. The electronic fabric can include a first fabric layer, a second fabric layer, and a plurality of electronic devices coupled to the second fabric layer. The first fabric layer can include a first set of conductive wires extending longitudinally in a first direction. The second fabric layer can define a plurality of apertures and can include a second set of conductive wires extending longitudinally in a second direction. The second fabric layer can be coupled to the first fabric layer such that each of the first set of conductive wires is arranged at a location of one of the plurality of apertures. Each of the plurality of electronic devices can have a first terminal electrically coupled with one of the first set of conductive wires and a second terminal electrically coupled to one of the second set of conductive wires. The first terminal can be electrically coupled with the one of the first set of conductive wires through one of the plurality of apertures.

According to other aspects, the present disclosure relates to an illuminable fabric that includes a first fabric layer, a second fabric layer, an insulation layer, and a plurality of light emitting diodes (LEDs). The first fabric layer can include a first set of conductive wires extending longitudinally in a first direction. The second fabric layer can be coupled to the first fabric layer and including a second set of conductive wires extending longitudinally in a second direction. The plurality of LEDs can be coupled to the first and second fabric layers. Each of the plurality of LEDs can have a first terminal electrically coupled with one of the first set of conductive wires and a second terminal electrically coupled to one of the second set of conductive wires. At least one of the first fabric layer, the second fabric layer, and the insulation layer can define a plurality of apertures, and the first terminal of each of the plurality of LEDs can be electrically coupled with one of the first set of conductive wires through one of the plurality of apertures.

According to certain aspects of the present disclosure, an illuminable fabric can include a fabric substrate, a first set of conductive wires, a second set of conductive wires, and a plurality of LEDs. The fabric substrate can have a first side and a second side opposite the first side. The fabric substrate can also define a plurality of apertures, each of the plurality of apertures extends from the first side to the second side. The first set of conductive wires can extend longitudinally in a first direction and be arranged on the first side of the fabric substrate. The second set of conductive wires can extend longitudinally in a second direction and be arranged on the second side of the fabric substrate. The plurality of LEDs can be coupled to the fabric substrate. Each of the plurality of LEDs can have a first terminal electrically coupled with one of the first set of conductive wires and a second terminal electrically coupled to one of the second set of conductive wires through one of plurality of apertures.

According to further aspects of the present disclosure, an illuminable fabric can include a fabric substrate, a first set of conductive wires, a second set of conductive wires, and a plurality of LEDs. The first set of conductive wires can extend longitudinally in a first direction and be arranged on the fabric substrate. The second set of conductive wires can extend longitudinally in a second direction and be arranged on the fabric substrate. The second set of conductive wires can be electrically insulated from the first set of conductive wires. The plurality of LEDs can be coupled to the fabric substrate. Each of the plurality of LEDs can have a first terminal electrically coupled with one of the first set of conductive wires and a second terminal electrically coupled to one of the second set of conductive wires through one of plurality of apertures.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
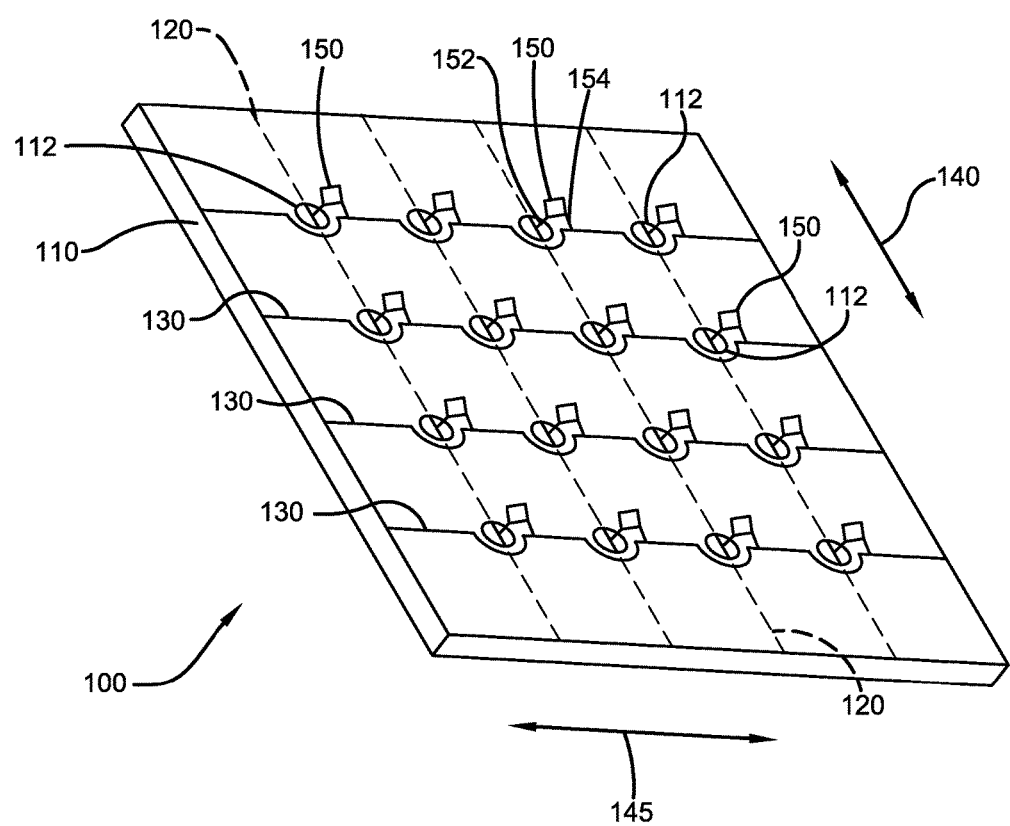
FIG. 1 is a perspective, partially schematic view of an example illuminable fabric according to some aspects of the present disclosure.

As discussed above, a need exists for an improved electronic fabric that more seamlessly integrates electronic componentry (such as, LEDs) into the fabric such that items manufactured from the fabric have a better appearance. Further, a need exists for an improved electronic fabric that can be manufactured more easily and/or inexpensively, thereby resulting in a more easily manufactured/less expensive item made from such fabric.

To address these and other needs, the present disclosure is directed to an electronic fabric that includes a plurality of electronic components arranged on a fabric substrate. The fabric substrate can have a single layer construction, or alternatively can be made of a plurality of fabric layers. Two sets of conductive wires are arranged on the fabric substrate in various configurations. In each case, a conductive wire from one set of conductive wires is connected to one terminal, and a conductive wire from the other set of conductive wires is connected to the other terminal, of each of the plurality of electronic components. In this manner, each electronic component may be energized by completing a circuit through, and applying a power source to, its associated wires.

The two sets of conductive wires are electrically insulated from each other, connecting to each other only through the electronic components. In some aspects, an insulation layer is arranged between the two sets of conductive wires. Alternatively or additionally, one or more insulators are arranged at each location where wires from the two sets would otherwise be in contact, e.g., where the wires cross each other. The wires can be arranged on the fabric substrate in many ways. As an example, one or more of the wires can be laminated on the fabric substrate. As another, wires can be woven into the fabric substrate. Other structures for coupling the wires to the fabric substrate are within the scope of the present disclosure.

The plurality of electronic components can be coupled to the fabric substrate individually, or as a group, e.g., attached to a layer (such as a dielectric sheet) of the fabric substrate. In some aspects, terminals of the electronic components may be connected to contact pads. Such contact pads can be larger than the terminals of the electronic components to assist with the electrical connection between the electronic components and the plurality of wires and to provide a greater tolerance for misalignment between the elements.

In order to electrically couple the wires to the electronic components, one or more of the fabric substrate, insulation layers, etc. can define one or more apertures (or holes) through which the terminals of the electronic components can be connected to the wires. Depending on the particular construction of the illuminable fabric, the apertures can be formed in the fabric substrate (or one or more layers thereof), an insulation layer (such as a dielectric sheet), or a combination thereof.

Examples of specific configurations of various electronic fabrics are described below. It should be appreciated that these examples are not limiting, and aspects of the described examples can be combined, excluded, etc. to form an electronic fabric in accordance with this disclosure. Furthermore, while each of the examples below describes an electronic component that includes two terminals, the present disclosure is equally applicable, mutatis mutandis, to electronic components with fewer or more terminals. Additionally, the examples described below relate to an electronic fabric that takes the form of an illuminable fabric. An illuminable fabric can be a particular type of an electronic fabric that includes a source of light or lighting as at least one of its electronic components. It should further be appreciated that, while each of the examples below describes an illuminable fabric that includes one or more LEDs, the details of each of the examples could instead be applied, mutatis mutandis, to a different type of electronic fabric that includes one or more electronic components different from LEDs. Example electronic components include, but are not limited to, chipsets, WiFi, Bluetooth, and/or other communication devices, antennae, transceivers, sensors, and piezoelectric or other actuators.

Referring now to FIG. 1, an example illuminable fabric 100 according to some aspects of the present disclosure is illustrated. The illuminable fabric 100 includes a fabric substrate 110, a first set of conductive wires 120, a second set of conductive wires 130, and a plurality of LEDs 150. The fabric substrate 110 can be created from a number of textile fibers that are weaved, knitted, and/or otherwise coupled together. Depending on the type of textile fibers utilized, the fabric substrate 110 can be bent, stretched, flexed, or otherwise manipulated in one or more directions. In this manner, the illuminable fabric 100 can have a flexible construction and be utilized to form, or be a part of, numerous types of items, as more fully discussed below.

The first and second set of conductive wires 120, 130 can be arranged on the fabric substrate 110. The first set of conductive wires 120 can extend longitudinally in a first direction 140, and the second set of conductive wires can extend longitudinally in a second direction 145. In some aspects, and as shown in FIG. 1, the first and second directions 140, 145 can be substantially orthogonal to each other. In other aspects, the first and second directions 140, 145 can be substantially parallel to each other (not shown), or arranged in any other orientation.

The first set of conductive wires 120 and/or the second set of conductive wires 130 can be arranged on the fabric substrate by being woven into the fabric substrate 110. In this manner, the wires of the first and/or second set of wires 120, 130 can be integrated directly into the fabric substrate 110. In other aspects, the first set of conductive wires 120 and/or the second set of conductive wires 130 can be arranged on the fabric substrate by being adhered to or formed on the fabric substrate 110, e.g., via an adhesive or by being laminated on the fabric substrate 110. Additionally or alternatively, the first and/or second sets of conductive wires 120, 130 can comprise a printed metal or electronic ink that is formed, deposited, etc. on the fabric substrate 110.

The plurality of LEDs 150 can be coupled to the fabric substrate 110. Each of the plurality of LEDs 150 has a first terminal 152 and a second terminal 154. The first terminal 152 can be electrically coupled with one of the first set of conductive wires 120, and the second terminal 154 can be electrically coupled with one of the second set of conductive wires 130. In this manner, each LED 150 can be individually addressed by completing a circuit with a power source (not shown) through its corresponding wires of the first and second sets of conductive wires 120, 130.

As shown in FIG. 1, the fabric substrate 110 can define a plurality of apertures 112. The plurality of apertures 112 can be arranged at a location proximate to where the first and second set of conductive wires 120, 130 would otherwise be in contact, such as where they intersect, as shown in FIG. 1. Each of the plurality of apertures 112 can also be arranged at a location proximate to a location where one of the plurality of LEDs 150 is coupled to the fabric substrate 110. In this manner, the first terminal 152 can be electrically coupled with one of the first set of conductive wires 120, and/or the second terminal 154 can be electrically coupled with one of the second set of conductive wires 130, through one of the plurality of apertures 112.

The first and second set of conductive wires 120, 130 can be connected to a power source (not shown) via a plurality of electrical connections 180 formed/coupled/etc., e.g., on one or more edges of the fabric substrate 110. The electrical connections 180 can include, for example, a multiplexer or other type of electrical device that provides for addressability of the individual LEDs 150. In some aspects, clips or other types of electrical connectors from the power source can be electrically coupled to the electrical connections 180 to power the LEDs 150. It should be appreciated that the aspects above are merely examples, and other types of electrical connections 180 are within the scope of the present disclosure.

Figure 2:
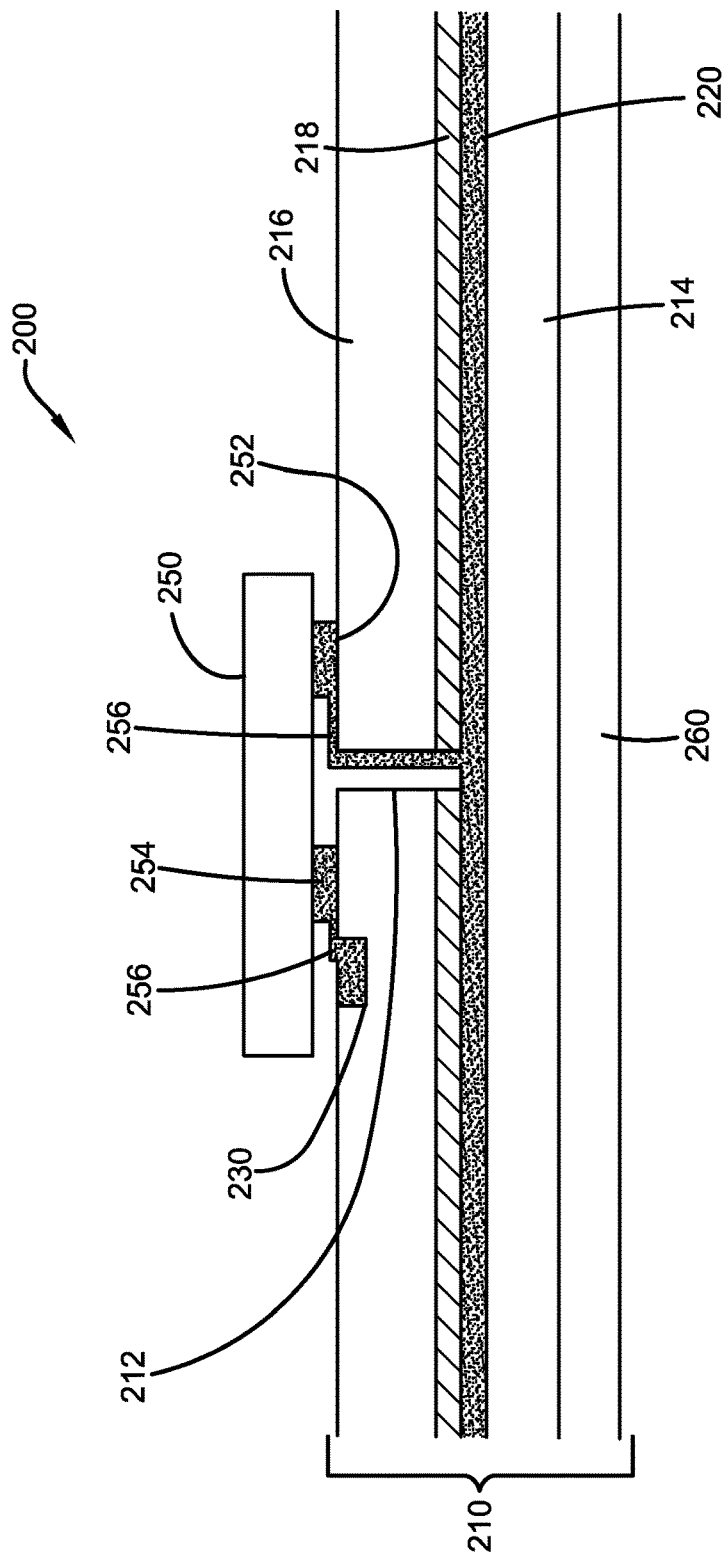
FIG. 2 is a partial sectional view of an example illuminable fabric according to some aspects of the present disclosure.

Referring now to FIG. 2, a partial sectional view an example illuminable fabric 200 is shown. The illuminable fabric 200 is similar to the illuminable fabric 110 of FIG. 1. Specifically, the illuminable fabric 200 comprises a fabric substrate 210, a first set of conductive wires 220, a second set of conductive wires 230, and a plurality of LEDs 250. The partial sectional view of FIG. 2 is taken at a location where one of the plurality of LEDs 250 is electrically coupled with the first and second set of conductive wires 220, 230, as more fully described below.

The fabric substrate 210 can include a first fabric layer 214 and a second fabric layer 216. The first fabric layer 214 can include the first set of conductive wires 220, and the second fabric layer 216 can include the second set of conductive wires 230. As mentioned above, the first and second set of conductive wires 220, 230 can be integrated directly into the fabric substrate 210 (e.g., into first fabric layer 214 and second fabric layer 216, respectively), can be arranged on the fabric substrate 210 by being adhered to or formed on the fabric substrate 210 or one of its layers, e.g., via an adhesive or by lamination, or a combination thereof. In the illustrated example of FIG. 2, the second fabric layer 216 defines a plurality of apertures 212 through which an LED 250 can be electrically coupled with one of the first set of conductive wires 220.

The fabric substrate 210 further includes an insulation layer 218 arranged between the first and second fabric layers 214, 216. The insulation layer 218 electrically insulates the first set of conductive wires 220 from the second set of conductive wires 230. The insulation layer 218 can take many different forms. For example only, the insulation layer 218 can comprise a dielectric sheet or other insulating material arranged between the first and second fabric layers 214, 216. In some aspects, the insulation layer 218 can comprise an insulating adhesive that is used to couple the first fabric layer 214 to the second fabric layer 216.

Each of the plurality of LEDs 250 includes a first terminal 252 and a second terminal 254 through which the LED can be energized. The first terminal 252 can be electrically coupled with one of the first set of conductive wires 220, and the second terminal 254 can be electrically coupled with one of the second set of conductive wires 230. As shown in FIG. 2, the first terminal 252 can be electrically coupled with one of the first set of conductive wires 220 through one of the apertures 212 formed in the second fabric layer 216. In this manner, the second fabric layer 216 can insulate (alone or in combination with insulation layer 218) the first and second sets of conductive wires 220, 230 from each other.

The connection between the first and second terminals 252, 254 and the first and second sets of conductive wires 220, 230, respectively, can take any acceptable form. In the illustrated example, a conductive trace 256 is utilized to electrically couple the wires 220, 230 and the LEDs 250. In another example, an intermediate conductive layer (not shown), such as an anisotropic conductive film or a solution processed conductive file, can be utilized to electrically couple the wires 220, 230 and the LEDs 250. In yet another example, and as described more fully below with respect to FIG. 4, one or more of the terminals 252, 254 can be electrically coupled with a contact pad that is electrically coupled with the wires 220, 230.

In some aspects, the fabric substrate 210 can also include a diffuser 260 that is coupled to the first fabric layer 214 and/or the second fabric layer 216. The diffuser 260 can be configured to provide diffusion of light generated by the plurality of LEDs 250. The light generated by the plurality of LEDs 250 can travel in a direction (downwardly in FIG. 2) toward and through the diffuser 260. In this manner, and depending on the level of diffusion provided by the diffusion layer 260, the distribution of light from one or more of the plurality of LEDs 250 can be more uniform across the illuminable fabric 200, rather as separate point sources of light provided by individual LEDs. It should be appreciated that, while shown as being coupled directly to the first fabric layer 214, the illustrated diffuser 260 can be directly coupled with the fabric substrate 210 in other configurations.

Figure 3:
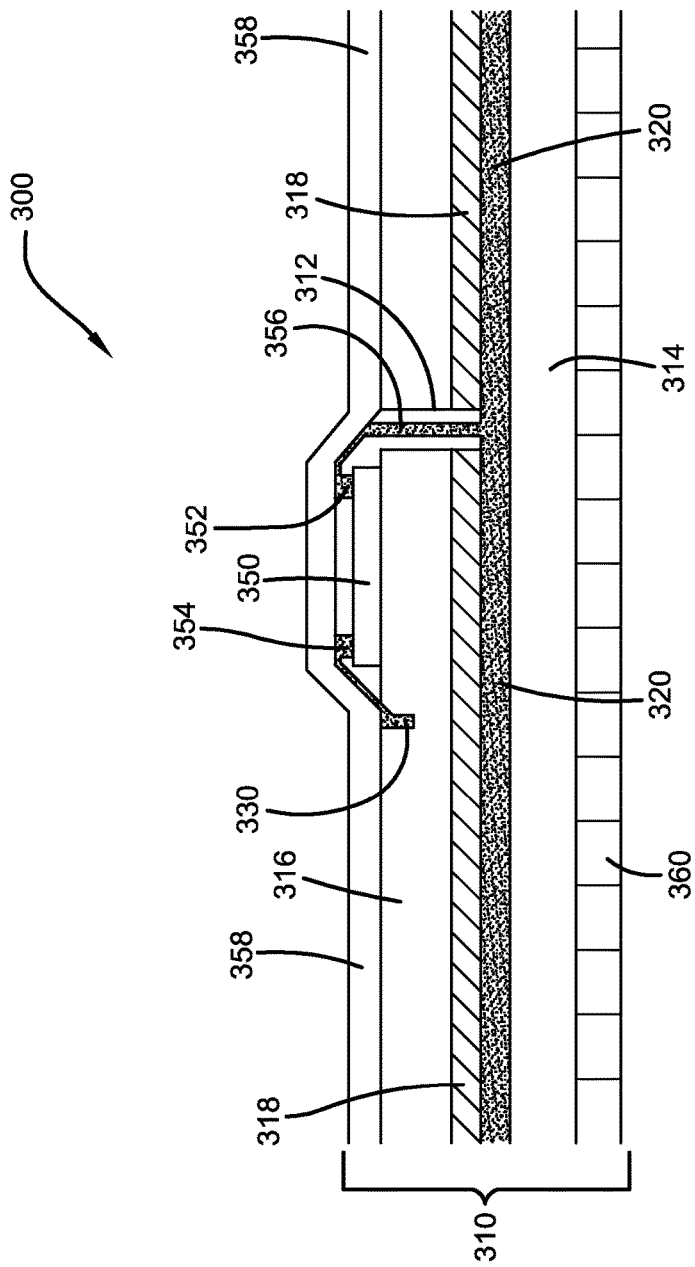
FIG. 3 is a partial sectional view of another example illuminable fabric according to some aspects of the present disclosure.

Referring now to FIG. 3, a partial sectional view another example illuminable fabric 300 is shown. The illuminable fabric 300 is similar to the illuminable fabrics 100, 200 of FIGS. 1-2. Specifically, the illuminable fabric 300 comprises a fabric substrate 310, a first set of conductive wires 320, a second set of conductive wires 330, and a plurality of LEDs 350. Similar to FIG. 2, the partial sectional view of FIG. 3 is taken at a location where one of the plurality of LEDs 350 is electrically coupled with the first and second set of conductive wires 320, 330.

The fabric substrate 310 can include a first fabric layer 314 and a second fabric layer 316. The first fabric layer 314 can include the first set of conductive wires 320, and the second fabric layer 316 can include the second set of conductive wires 330. As mentioned above, the first and second set of conductive wires 320, 330 can be integrated directly into the fabric substrate 310 (e.g., into first fabric layer 314 and second fabric layer 316, respectively), can be arranged on the fabric substrate 310 by being adhered to or formed on the fabric substrate 310 or one of its layers, e.g., via an adhesive or by lamination, or a combination thereof. In the illustrated example of FIG. 3, the second fabric layer 316 defines a plurality of apertures 312 through which an LED 350 can be electrically coupled with one of the first set of conductive wires 320.

The fabric substrate 310 further includes an insulation layer 318 arranged between the first and second fabric layers 314, 316. The insulation layer 318 electrically insulates the first set of conductive wires 320 from the second set of conductive wires 330. The insulation layer 318 can take many different forms. For example only, the insulation layer 318 can comprise a dielectric sheet or other insulating material arranged between the first and second fabric layers 314, 316. In some aspects, the insulation layer 318 can comprise an insulating adhesive that is used to couple the first fabric layer 314 to the second fabric layer 316.

Each of the plurality of LEDs 350 includes a first terminal 352 and a second terminal 354 through which the LED can be energized. The first terminal 352 can be electrically coupled with one of the first set of conductive wires 320, and the second terminal 354 can be electrically coupled with one of the second set of conductive wires 330. As shown in FIG. 3, the first terminal 352 can be electrically coupled with one of the second set of conductive wires 320 through one of the apertures 312 formed in the second fabric layer 316. In this manner, the second fabric layer 316 can insulate (alone or in combination with insulation layer 318) the first and second sets of conductive wires 320, 330 from each other.

The primary difference between the illuminable fabric 300 and the illuminable fabric 200 described above is that the plurality of LEDs 350 on illuminable fabric 300 are arranged on or in a dielectric sheet of material 358 that is coupled to the fabric substrate 310 (e.g., the second fabric layer 316). In this manner, and as mentioned above, the plurality of LEDs 350 can be coupled to the fabric substrate 310 as a group rather than individually. It should be appreciated that groups of less than the entire plurality of LEDs 350 may be arranged on or in a dielectric sheet of material 358 such that one group of LEDs, multiple groups of LEDs, or individual LEDs may be coupled to the same fabric substrate 310.

The connection between the first and second terminals 352, 354 and the first and second sets of conductive wires 320, 330, respectively, can take any acceptable form. In the illustrated example, a conductive trace 356 is utilized to electrically couple the first set of wires 320 and the first terminal 352, and a direct physical connection electrically couples the second set of wires 330 and the second terminal 354. In another example, an intermediate conductive layer (not shown), such as an anisotropic conductive film or a solution processed conductive film, could be utilized to electrically couple the wires 320, 330 and the LEDs 350. In yet another example, and as described more fully below with respect to FIG. 4, one or more of the terminals 352, 354 can be electrically coupled with a contact pad that is electrically coupled with the wires 320, 330.

The example fabric substrate 310 shown also includes a diffuser 360 that is coupled to the first fabric layer 314 and/or the second fabric layer 316. The diffuser 360 can be configured to provide diffusion of light generated by the plurality of LEDs 350. The light generated by the plurality of LEDs 350 can travel in a direction (downwardly in FIG. 3) toward and through the diffuser 360. In this manner, and depending on the level of diffusion provided by the diffusion layer 360, the distribution of light from one or more of the plurality of LEDs 350 can be more uniform across the illuminable fabric 300, rather as separate point sources of light provided by individual LEDs. It should be appreciated that, while shown as being coupled directly to the first fabric layer 314, the illustrated diffuser 360 can be directly coupled with the fabric substrate 310 in other configurations.

Figure 4:
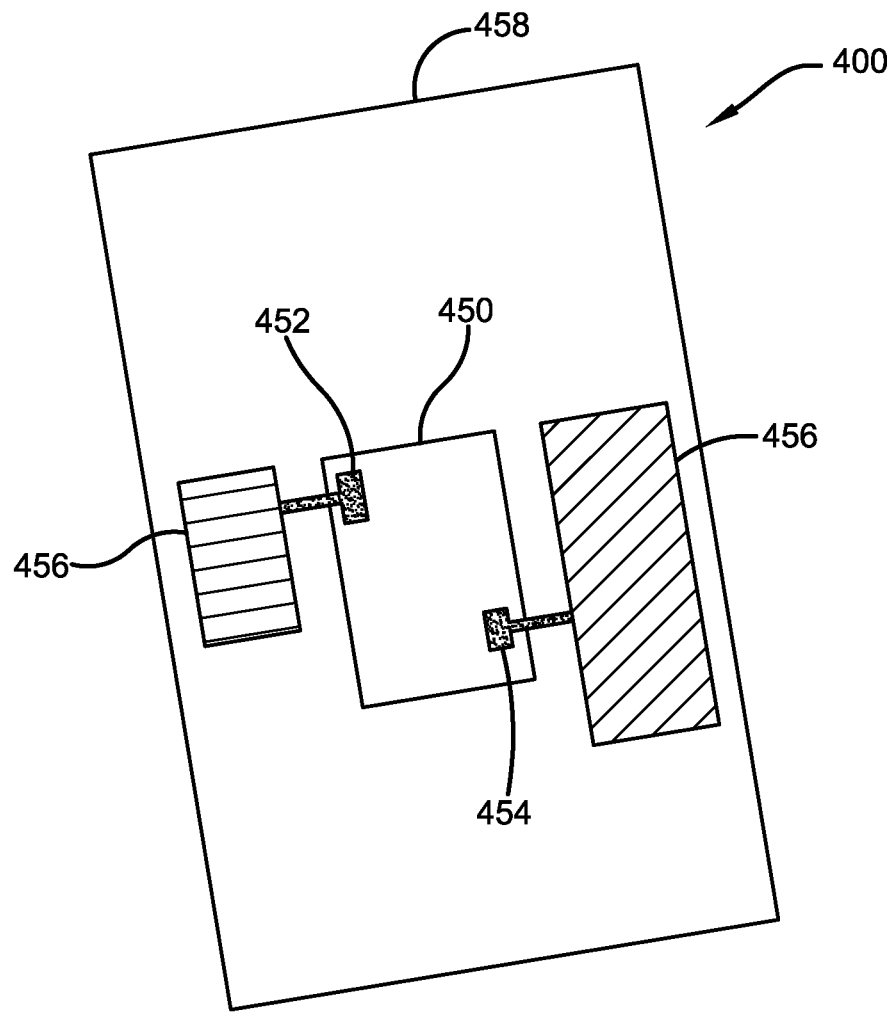
FIG. 4 is a partial schematic view of an example LED assembly for use with an illuminable fabric according to some aspects of the present disclosure.

Referring now to FIG. 4, an example LED assembly 400 according to some aspects of the present disclosure is shown. The LED assembly 400 includes one or more LEDs 450 and a plurality of contact pads 456. One of the plurality of contact pads 456 is connected to a first terminal 452 of the LED 450, and another of the plurality of contact pads 456 is connected to a second terminal 454 of the LED 450. The LED assembly 400 can be utilized with any of the illuminable fabrics (100, 200, etc.) described herein. The contact pads 456 can be larger than the terminals 452, 454, of the LED 450 to assist with the electrical connection between the LED 450 and the first and second sets of wires (120, 130, 220, 230, etc.) of the illuminable fabric. For example only, the contact pads 456 can provide for a larger or otherwise more suitable connection point for electrical connections, which may provide for a greater tolerance for misalignment between the elements of the illuminable fabric.

The LED assembly 400 can also be coupled to, or form a part of, a dielectric sheet 458 in or upon which the contact pads 456 can be formed. As described more fully below, the two contact pads 456 for each LED 450 can be formed on the same or different sides of the dielectric sheet 458, depending on the particular design of the illuminable fabric of which it will be a part. While shown as being on the same side of the dielectric sheet 458, the contact pads 456 and the LED 450 can alternatively be on opposite sides, e.g., by having an electrical connection through an aperture or via. In further examples, one or more contact pads 456 can be on the same side as the LED 450, and one or more other contact pads 456 can be on the opposite side.

Figure 5:
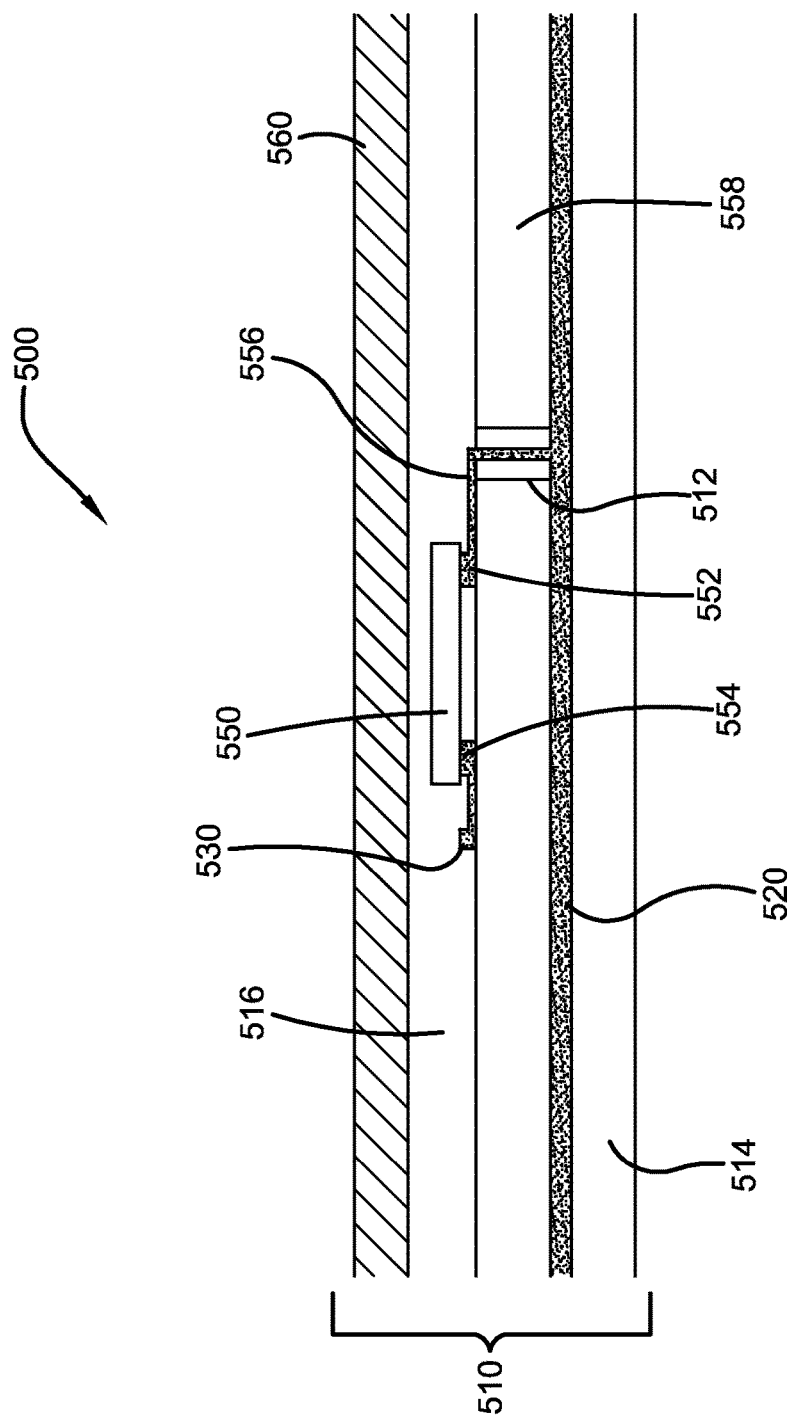
FIG. 5 is a partial sectional view of another example illuminable fabric according to some aspects of the present disclosure.

Referring now to FIG. 5, a partial sectional view another example illuminable fabric 500 is shown. The illuminable fabric 500 is similar to the illuminable fabrics 100, 200, 300 of FIGS. 1-3. Specifically, the illuminable fabric 500 comprises a fabric substrate 510, a first set of conductive wires 520, a second set of conductive wires 530, and a plurality of LEDs 550. Similar to FIGS. 2-3, the partial sectional view of FIG. 5 is taken at a location where one of the plurality of LEDs 550 is electrically coupled with the first and second set of conductive wires 520, 530.

The fabric substrate 510 can include a first fabric layer 514 and a second fabric layer 516. The first fabric layer 514 can include the first set of conductive wires 520, and the second fabric layer 516 can include the second set of conductive wires 530. As mentioned above, the first and second set of conductive wires 520, 530 can be integrated directly into the fabric substrate 510 (e.g., into first fabric layer 514 and second fabric layer 516, respectively), can be arranged on the fabric substrate 510 by being adhered to or formed on the fabric substrate 510 or one of its layers, e.g., via an adhesive or by lamination, or a combination thereof.

Each of the plurality of LEDs 550 includes a first terminal 552 and a second terminal 554 through which the LED can be energized. The first terminal 552 can be electrically coupled with one of the first set of conductive wires 520, and the second terminal 554 can be electrically coupled with one of the second set of conductive wires 530. The primary difference between the illuminable fabric 500 and the illuminable fabrics 200, 300 described above is that the plurality of LEDs 350 on illuminable fabric 500 are arranged on or in a dielectric sheet of material 558 that is coupled to the fabric substrate 510 and arranged between the first and second fabric layers 514, 516. In this manner, and as mentioned above, the plurality of LEDs 550 can be coupled to the fabric substrate 510 as a group rather than individually. It should be appreciated that groups of less than the entire plurality of LEDs 550 may be arranged on or in a dielectric sheet of material 558 such that one group of LEDs, multiple groups of LEDs, or individual LEDs may be coupled to the same fabric substrate 510. Furthermore, the dielectric sheet of material 558 can electrically insulate the first set of conductive wires 520 from the second set of conductive wires 530, performing a function similar to the insulation layer 218, 318 described above with regards to illuminable fabrics 200, 300. In some aspects, the dielectric sheet of material 558 can comprise a ribbon of material, and/or parts of the dielectric sheet of material 558 can be removed during or after the manufacturing process to expose the fabric substrate 510.

In the illustrated example of FIG. 5, and in contrast to the examples above, the dielectric sheet of material 558 defines a plurality of apertures 512 through which an LED 550 can be electrically coupled with one of the first set of conductive wires 520. The connection between the first and second terminals 552, 554 and the first and second sets of conductive wires 520, 530, respectively, can take any acceptable form. In the illustrated example, a conductive trace 556 is utilized to electrically couple the first and second sets of wires 520, 530 and the first and second terminals 552, 554, respectively. In another example, an intermediate conductive layer (not shown), such as an anisotropic conductive film or solution processed conductive film, could be utilized to electrically couple the wires 520, 530 and the LEDs 550. In yet another example, and as described above with respect to FIG. 4, one or more of the terminals 552, 554 can be electrically coupled with a contact pad that is electrically coupled with the wires 520, 530.

The example fabric substrate 510 shown also includes a diffuser 560 that is coupled to the first fabric layer 514 and/or the second fabric layer 516. The diffuser 560 can be configured to provide diffusion of light generated by the plurality of LEDs 550. In this manner, and depending on the level of diffusion provided by the diffusion layer 560, the distribution of light from one or more of the plurality of LEDs 550 can be more uniform across the illuminable fabric 500, rather as separate point sources of light provided by individual LEDs. It should be appreciated that, while shown as being coupled directly to the second fabric layer 514, the illustrated diffuser 560 can be directly coupled with the fabric substrate 510 in other configurations.

Figure 6:
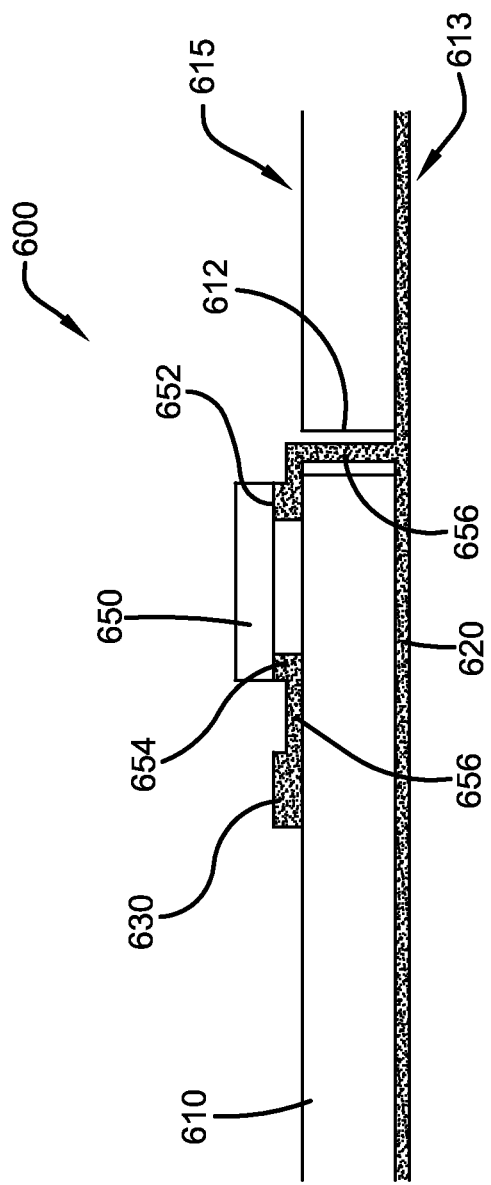
FIG. 6 is a partial sectional view of another example illuminable fabric according to some aspects of the present disclosure.

Referring now to FIG. 6, a partial sectional view of yet another example illuminable fabric 600 is shown. The illuminable fabric 600 is similar to the illuminable fabrics 100, 200, 300, 500 of FIGS. 1-3 and 5. Specifically, the illuminable fabric 600 comprises a fabric substrate 610, a first set of conductive wires 620, a second set of conductive wires 630, and a plurality of LEDs 650. Similar to FIGS. 2-3 and 5, the partial sectional view of FIG. 6 is taken at a location where one of the plurality of LEDs 650 is electrically coupled with the first and second set of conductive wires 620, 630.

In the example illuminable fabric 600, the fabric substrate 610 includes the first and second sets of conductive wires 620, 630 arranged on opposing sides of the fabric substrate 610. More specifically, the first set of conductive wires 620 can be arranged on a first side 613, and the second set of conductive wires 630 can be arranged on a second side 615, of the fabric substrate 610. In this manner, the fabric substrate 610 can separate and electrically insulate the first and second sets of conductive wires 623, 630, similar to insulation layers 218, 318 and dielectric sheet of material 558 described above.

The fabric substrate 610 can also define a plurality of apertures 612 through which an LED 650 can be electrically coupled with one of the first set of conductive wires 620. As mentioned above, the first and second set of conductive wires 620, 630 can be integrated directly into the fabric substrate 610, can be arranged on the fabric substrate 610 by being adhered to or formed on the fabric substrate 610 or one of its layers, e.g., via an adhesive or by lamination, or a combination thereof.

Each of the plurality of LEDs 650 includes a first terminal 652 and a second terminal 654 through which the LED 650 can be energized. The first terminal 652 can be electrically coupled with one of the first set of conductive wires 620, and the second terminal 654 can be electrically coupled with one of the second set of conductive wires 630. As shown in FIG. 6, the first terminal 652 can be electrically coupled with one of the first set of conductive wires 620 through one of the apertures 612 formed in the fabric substrate 610.

While a single LED 650 is shown in FIG. 6, it should be appreciated that the plurality of LEDs 650 can be coupled to the fabric substrate 610 as a group rather than individually. It should also be appreciated that groups of less than the entire plurality of LEDs 650 may be arranged on fabric substrate 610 such that one group of LEDs, multiple groups of LEDs, or individual LEDs may be coupled to the same fabric substrate 610. While not specifically illustrated in FIG. 6, the present disclosure also contemplates that the plurality of LEDs 650 can be coupled to, or form a part of, a dielectric sheet, as described above.

The connection between the first and second terminals 652, 654 and the first and second sets of conductive wires 620, 630, respectively, can take any acceptable form. In the illustrated example, a conductive trace 656 is utilized to electrically couple the first and second sets of wires 620, 630 and the first and second terminals 652, 654, respectively. In another example, an intermediate conductive layer (not shown), such as an anisotropic conductive film or solution processed conductive film, could be utilized to electrically couple the wires 620, 630 and the LEDs 650. In yet another example, and as described above with respect to FIG. 4, one or more of the terminals 652, 654 can be electrically coupled with a contact pad that is electrically coupled with the wires 620, 630.

While the example fabric substrate 610 is illustrated as a single layer, it should be appreciated that the fabric substrate 610 can be constructed of one or a plurality of layers. It should also be appreciated that the illuminable fabric 600 as illustrated could be modified to include layers/elements (diffuser layers, insulation layers, additional LEDs or other electronic components, etc.) in addition to those illustrated without departing from the teachings of the present disclosure. For example only, the illuminable fabric 600 could be modified by being encapsulated with an insulating adhesive or other layer to provide physical protection, electrically insulation, etc. to the illuminable fabric 600. While not specifically illustrated or described, such modifications are within the scope of the present disclosure.

Figure 7A:
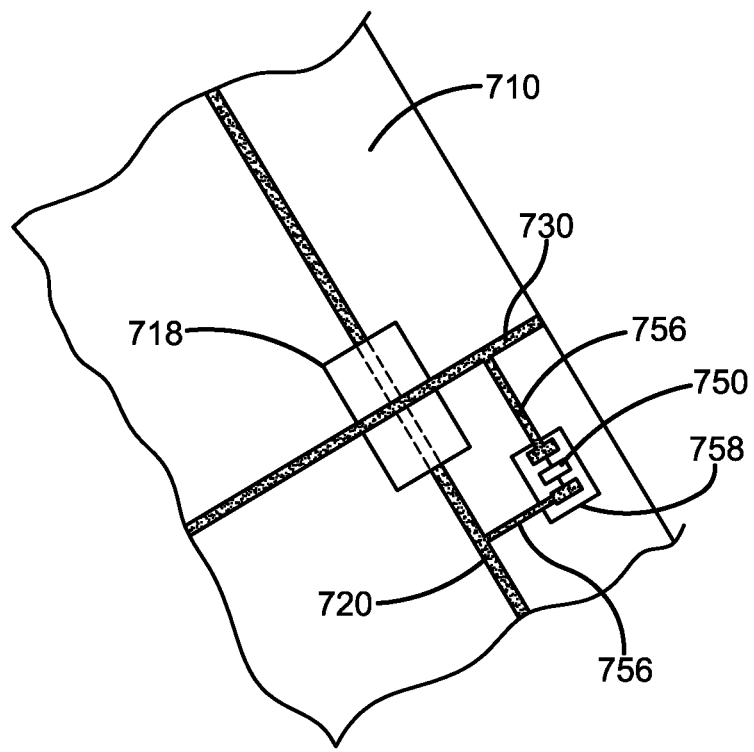
FIGS. 7A and 7B are a partial perspective and partially schematic view and a partial sectional view of another example illuminable fabric according to some aspects of the present disclosure.
Figure 7B:
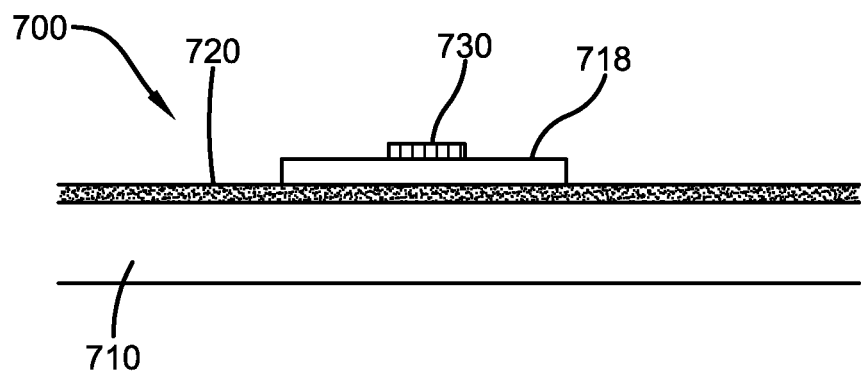

Referring now to FIGS. 7A and 7B, a partial perspective view and a partial sectional view, respectively, of yet another example illuminable fabric 700 is shown. The illuminable fabric 700 is similar to the illuminable fabrics 100, 200, 300, 500, 600 of FIGS. 1-3 and 5-6. Specifically, the illuminable fabric 700 comprises a fabric substrate 710, a first set of conductive wires 720, a second set of conductive wires 730, and a plurality of LEDs 750. The plurality of LEDs 750 are illustrated as being coupled to a dielectric sheet 758, similar to dielectric sheet 458 described above.

In the example illuminable fabric 700, the first and second set of conductive wires 720, 730 can be arranged on the fabric substrate 710. The first set of conductive wires 720 can extend longitudinally in a first direction 740, and the second set of conductive wires 730 can extend longitudinally in a second direction 745. In some aspects, and as shown in FIG. 7, the first and second directions 740, 745 can be substantially orthogonal to each other. In other aspects, the first and second directions 740, 745 can be substantially parallel to each other (not shown), or arranged in any other orientation.

In the example illuminable fabric 700, one or more insulators 718 are coupled to the fabric substrate 710. The one or more insulators 718 electrically insulate each of the first set of conductive wires 720 from each of the second set of conductive wires 730 at locations where these wires 720, 730 are in proximity, e.g., at locations where the wires 720, 730 cross (see FIG. 7A). The partial sectional view of FIG. 7B is taken at a location where wires 720, 730 cross. In this manner, each of the plurality of LEDs 750 can be coupled to one of both the first and second sets of conductive wires 720, 730 without requiring an electrical connection (such as a conductive trace 756 as illustrated) to extend through an aperture defined by a layer of the fabric substrate 710.

The remaining aspects of the illuminable fabric 700 are similar to the other illuminable fabrics 100, 200, etc. described above. The first and second set of conductive wires 720, 730 can be integrated directly into the fabric substrate 710, can be arranged on the fabric substrate 710 by being adhered to or formed on the fabric substrate 710 or one of its layers, e.g., via an adhesive or by lamination, by being weaved or knit within the fabric substrate 710, or a combination thereof. Each of the plurality of LEDs 750 includes a first terminal 752 and a second terminal 754 through which the LED 750 can be energized. The first terminal 752 can be electrically coupled with one of the first set of conductive wires 720, and the second terminal 754 can be electrically coupled with one of the second set of conductive wires 730.

While a single LED 750 is shown in FIG. 7A, it should be appreciated that the plurality of LEDs 750 can be coupled to the fabric substrate 710 as a group rather than individually. It should also be appreciated that groups of less than the entire plurality of LEDs 750 may be arranged on fabric substrate 710 such that one group of LEDs, multiple groups of LEDs, or individual LEDs may be coupled to the same fabric substrate 710. In the illustrated embodiment, an LED 750 is attached to a dielectric sheet 758, in a manner similar to the LED assembly 400 described above.

The connection between the first and second terminals 752, 754 and the first and second sets of conductive wires 720, 730, respectively, can take any acceptable form. In the illustrated example, a conductive trace 756 is utilized to electrically couple the first and second sets of wires 720, 730 and the first and second terminals 752, 754, respectively. In another example, an intermediate conductive layer (not shown), such as an anisotropic conductive film or solution processed conductive film, could be utilized to electrically couple the wires 720, 730 and the LEDs 750. In yet another example, and as described above with respect to FIG. 4, one or more of the terminals 752, 754 can be electrically coupled with a contact pad that is electrically coupled with the wires 720, 730.

While the example fabric substrate 710 is illustrated as a single layer, it should be appreciated that the fabric substrate 710 can be constructed of one or a plurality of layers. It should also be appreciated that the illuminable fabric 700 as illustrated could be modified to include layers/elements (diffuser layers, insulation layers, additional LEDs or other electronic components, etc.) in addition to those illustrated without departing from the teachings of the present disclosure. For example only, the illuminable fabric 700 could be modified by being encapsulated with an insulating adhesive or other layer to provide physical protection, electrically insulation, etc. to the illuminable fabric 700. While not specifically illustrated or described, such modifications are within the scope of the present disclosure.

The illuminable fabrics 100, 200, 300, 500, 600, and 700 can be utilized to form a part of any type of ultimate end product. For example only, the illuminable fabrics 100, 200, 300, 500, 600, and 700 can form a portion of a wearable product or device, such as clothing. Other types of products that can be formed from the described illuminable fabrics 100, 200, 300, 500, 600, and 700 include, but are not limited to, billboards, building materials, window coverings, wallpaper, cubicle partitions, protective clothing, medical covering (bandages, wrappings, clothing, etc.), bedding and bedding covers/sheets, automotive lighting, flexible displays, sensors, and camouflage.

Furthermore, the present disclosure should not be limited to the specific example implementations of the electronic or illuminable fabrics described above. It should be appreciated that feature(s) from one of the examples above could be combined with (or replace) feature(s) from another one of the examples and still be within the scope of the present disclosure. For example only, the LED assembly 400 with the dielectric sheet 458 illustrated in FIG. 4 (and/or the dielectric sheet of material 558 shown in FIG. 5) can be utilized and combined with any of the specific implementations shown in FIGS. 2-3 and 6. In such arrangements, the LED assembly 400/dielectric sheet of material 558 can be coupled to one or more fabric layers (214, 216, 314, 316, etc.). One or more of the fabric layers or the dielectric sheets may define apertures through which the terminals of the LED or other electronic device may be coupled. In this manner, the present disclosure describes a flexible design for an electronic fabric that can be adapted based on the intended use and application of the electronic fabric.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An illuminable fabric, comprising:
   a first fabric layer including a first set of conductive wires being woven therein and extending longitudinally in a first direction, the first fabric layer defining a plurality of first apertures;
   a second fabric layer coupled to the dielectric sheet and including a second set of conductive wires being woven therein and extending longitudinally in a second direction;
   an insulation layer arranged between the first and second fabric layers, the insulation layer electrically insulating the first set of conductive wires from the second set of conductive wires; and
   a plurality of dielectric sheets arranged between the first and second fabric layers, each of the plurality of dielectric sheets including a light emitting diode (LED) having a first terminal electrically coupled with a first contact pad and a second terminal electrically coupled to a second contact pad,
   wherein the first terminal of each LED is electrically coupled with one of the first set of conductive wires through one of the plurality of first apertures, the second terminal of each LED is electrically coupled with one of the second set of conductive wires, and each LED is individually addressable.

2. The illuminable fabric of claim 1, wherein each of the plurality of dielectric sheets defines a second aperture, and the second terminal of each LED is electrically coupled with one of the second set of conductive wires through the second aperture.

3. The illuminable fabric of claim 2, wherein the second direction is substantially orthogonal to the first direction.

4. The illuminable fabric of claim 3, further comprising a diffuser coupled to the first and second fabric layer, the diffuser configured to provide diffusion of light generated by the plurality of LEDs.

5. The illuminable fabric of claim 4, wherein the insulation layer comprises an adhesive used to couple the first fabric layer to the second fabric layer.

6. The illuminable fabric of claim 4, wherein the insulation layer comprises a plurality of insulators that electrically insulate each of the first set of conductive wires from each of the second set of conductive wires at locations where the wires cross.

7. The illuminable fabric of claim 1, wherein the second direction is substantially orthogonal to the first direction.

8. The illuminable fabric of claim 7, further comprising a diffuser coupled to the first and second fabric layer, the diffuser configured to provide diffusion of light generated by the plurality of LEDs.

9. The illuminable fabric of claim 8, wherein the insulation layer comprises an adhesive used to couple the first fabric layer to the second fabric layer.

10. The illuminable fabric of claim 8, wherein the insulation layer comprises a plurality of insulators that electrically insulate each of the first set of conductive wires from each of the second set of conductive wires at locations where the wires cross.

11. The illuminable fabric of claim 1, further comprising a diffuser coupled to the first and second fabric layer, the diffuser configured to provide diffusion of light generated by the plurality of LEDs.

12. The illuminable fabric of claim 11, wherein the insulation layer comprises an adhesive used to couple the first fabric layer to the second fabric layer.

13. The illuminable fabric of claim 11, wherein the insulation layer comprises a plurality of insulators that electrically insulate each of the first set of conductive wires from each of the second set of conductive wires at locations where the wires cross.

14. The illuminable fabric of claim 1, wherein the insulation layer comprises an adhesive used to couple the first fabric layer to the second fabric layer.

15. The illuminable fabric of claim 1, wherein the insulation layer comprises a plurality of insulators that electrically insulate each of the first set of conductive wires from each of the second set of conductive wires at locations where the wires cross.

16. The illuminable fabric of claim 2, further comprising a diffuser coupled to the first and second fabric layer, the diffuser configured to provide diffusion of light generated by the plurality of LEDs.

17. The illuminable fabric of claim 16, wherein the insulation layer comprises an adhesive used to couple the first fabric layer to the second fabric layer.

18. The illuminable fabric of claim 16, wherein the insulation layer comprises a plurality of insulators that electrically insulate each of the first set of conductive wires from each of the second set of conductive wires at locations where the wires cross.

19. The illuminable fabric of claim 2, wherein the insulation layer comprises an adhesive used to couple the first fabric layer to the second fabric layer.

20. The illuminable fabric of claim 2, wherein the insulation layer comprises a plurality of insulators that electrically insulate each of the first set of conductive wires from each of the second set of conductive wires at locations where the wires cross.

* * * * *